United States Patent
Kim

(10) Patent No.: US 7,919,369 B2
(45) Date of Patent: Apr. 5, 2011

(54) METHOD OF FABRICATING A FLASH MEMORY DEVICE

(75) Inventor: Soo Jin Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 869 days.

(21) Appl. No.: 11/856,700

(22) Filed: Sep. 17, 2007

(65) Prior Publication Data

US 2008/0268594 A1 Oct. 30, 2008

(30) Foreign Application Priority Data

Apr. 25, 2007 (KR) .................. 10-2007-0040431

(51) Int. Cl.
*H04L 21/336* (2006.01)
(52) U.S. Cl. ............. 438/257; 257/314; 257/E21.691; 257/E21.683
(58) Field of Classification Search .......... 257/314–316, 257/E21.66, E21.683, E21.678, E21.691; 438/201, 211, 257
See application file for complete search history.

(56) References Cited

U.S. PATENT DOCUMENTS

| 7,436,017 B2 * | 10/2008 | Lee et al. | 257/314 |
| 7,476,928 B2 * | 1/2009 | Kim | 257/314 |
| 7,598,564 B2 * | 10/2009 | Kang et al. | 257/316 |

FOREIGN PATENT DOCUMENTS

| KR | 100273705 B1 | 4/2000 |
| KR | 1020010061513 A | 7/2001 |
| KR | 1020010108988 A | 12/2001 |
| KR | 1020020095689 A | 12/2002 |

* cited by examiner

*Primary Examiner* — David Vu
(74) *Attorney, Agent, or Firm* — Kilpatrick Townsend & Stockton LLP

(57) ABSTRACT

In a method of fabricating a flash memory device, a lower capping conductive layer of a peri region is patterned. A step formed between a cell gate and a gate for a peri region transistor is decreased by controlling a target etch thickness of a hard mask. Thus, an impurity does not infiltrate into the bottom of the gate for the peri region transistor through a lost portion of a SAC nitride layer. Accordingly, a hump phenomenon of the transistor formed in the peri region can be improved. Furthermore, a leakage current characteristic of the transistor formed in the peri region can be improved.

18 Claims, 4 Drawing Sheets

METHOD OF FABRICATING A FLASH MEMORY DEVICE

CROSS-REFERENCES TO RELATED APPLICATIONS

The present application claims priority to Korean patent application number 10-2007-040431, filed on Apr. 25, 2007, which is incorporated by reference in its entirety.

BACKGROUND OF THE INVENTION

The present invention relates, in general, to a method of fabricating a flash memory device and, more particularly, to a method of fabricating a flash memory device which can improve a hump phenomenon of a transistor formed in a peri region.

A flash memory device is a memory device in which data is retained when a supply of power is removed. The flash memory device includes a charge-trapping layer for trapping charges between the gate of a transistor and a channel in order to implement a difference in a threshold voltage Vth of the channel. The threshold voltage Vth varies depending on a state where charges are injected into the charge-trapping layer, i.e., a program state or an erased state, so that a gate voltage Vg for activating the channel is changed. The operation of the flash memory device is implemented when the threshold voltage Vth is varied depending on charges stored in the charge-trapping layer.

In a typical flash memory devices, a floating gate employing a metal layer or a polysilicon layer is used as the charge-trapping layer. In Silicon-Oxide-Nitride-Oxide-Silicon (SONOS) devices, a silicon nitride layer is used as the charge-trapping layer.

In general, in the SONOS devices, a capping polysilicon layer is thickly formed on a gate insulating layer of a peri region. Therefore, if a charge-trapping layer, a blocking oxide layer and a polysilicon layer for a gate electrode of a region in which the gate of a transistor will be formed are selectively removed in the peri region, a stack type gate can be formed while preventing damage to the gate insulating layer.

However, a total height of the gate for the transistor in the peri region becomes higher than that of the cell gate in the cell region due to the thick polysilicon layer formed in the peri region. This results in the formation of a severe step between the cell region and the peri region. Consequently, after the interlayer insulating layer is deposited on the gate to form a contact plug in a subsequent process, a Self-Aligned Contact (SAC) nitride layer, which is formed on the surface of the gate in the peri region o protect the gate, is partially lost during a polishing process.

Thus, an impurity, such as hydrogen ($H_2$), is infiltrated into the bottom of the gate of the transistor in the peri region through the lost portion of the SAC nitride layer in a subsequent process, thereby degrading the gate insulating layer. A hump phenomenon, such as the occurrence of a leakage current, occurs due to the degraded gate insulating layer. The hump on the transistor of the peri region causes well stress failure, thereby leading to a reduced yield.

SUMMARY OF THE INVENTION

Accordingly, the present invention addresses the above problems, and discloses a method of fabricating a flash memory device which can improve the hump phenomenon of transistors formed in a peri region in a SONOS flash memory device.

In an aspect of the present invention, a method of fabricating a flash memory device includes forming a stack layer in a cell region of a semiconductor substrate. The stack layer includes a tunnel insulating layer, a charge-trapping layer, a blocking oxide layer and a first capping conductive layer. A gate insulating layer, a second capping conductive layer and the stack layer are formed in a peri region. The stack layer is etched at a region where a gate will be formed in the peri region, thereby forming a contact hole. A metal layer and a hard mask are formed over the stack layer including the contact hole. The stack layer of the cell region and the peri region is patterned to form a cell gate in the cell region. The hard mask is etched so that a step formed between the cell region and the peri region is decreased while patterning the second capping conductive layer of the peri region, thereby forming a gate of a transistor in the peri region.

In another aspect of the present invention, a method of fabricating a flash memory device includes forming a stack layer in a cell region of a semiconductor substrate. The stack layer includes a tunnel insulating layer, a charge-trapping layer, a blocking oxide layer and a first capping conductive layer. A gate insulating layer, a second capping conductive layer and the stack layer are formed in a peri region. The stack layer of a region where a gate will be formed in the peri region is etched to form a contact hole. A metal layer and a hard mask are formed over the stack layer including the contact hole. The stack layer of the cell region and the peri region is patterned to form a cell gate in the cell region. The second capping conductive layer and the gate insulating layer of the peri region are patterned. The hard mask of the peri region is etched so that a step formed between the cell region and the peri region is decreased, thereby forming the gate of a transistor in the peri region.

DESCRIPTION OF SPECIFIC EMBODIMENTS

A specific embodiment according to the present patent will be described with reference to the accompanying drawings.

FIGS. 1A to 1G are cross-sectional views illustrating a method of fabricating a SONOS memory device according to an embodiment of the present invention.

Figure 1A:
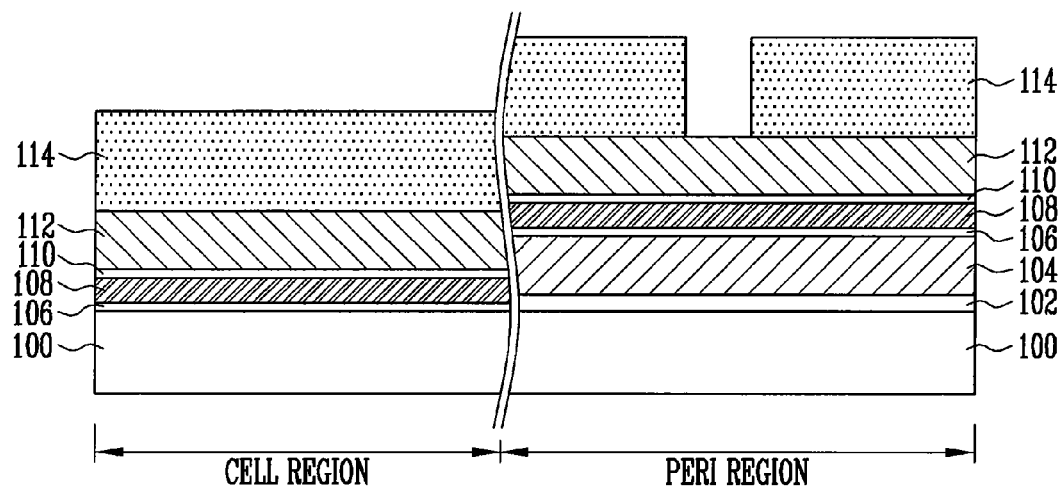
FIGS. 1A to 1G are cross-sectional views illustrating a method of fabricating a SONOS memory device according to an embodiment of the present invention.

Referring to FIG. 1A, a gate insulating layer 102 and a first capping conductive layer 104 are formed over a semiconductor substrate 100 of a cell region and a peri region. The gate insulating layer 102 and the first capping conductive layer 104 formed in the cell region are removed by an etch process employing a mask (not shown), so that the gate insulating layer 102 and the first capping conductive layer 104 remain only in the peri region. The gate insulating layer 102 can be formed of silicon oxide ($SiO_2$) by an oxidation process. The first capping conductive layer 104 serves to prevent damage to the gate insulating layer 102 when layers formed on the first capping conductive layer 104 in a region in which the gate of a transistor will be formed are selectively removed in a subsequent process. The first capping conductive layer 104 is used to form a stack gate. In one embodiment, the first capping conductive layer 104 is a polysilicon layer.

A stack layer of a tunnel insulating layer 106, a charge-trapping layer 108, a blocking oxide layer 110 and a second capping conductive layer 112 are formed over the semiconductor substrate 100 in the peri region including the first capping conductive layer 104. The stack layers are formed in the cell region and the peri region. The tunnel insulating layer 106 can be formed of silicon oxide ($SiO_2$). The charge-trapping layer 108 is formed from nitride-based dielectrics to provide a trap site for storing charges. The charges pass through the tunnel insulating layer 106. The charge-trapping layer 108 is preferably formed of silicon nitride ($Si_xN_y$). The charge-trapping layer 108 is primarily patterned in a direction parallel to an isolation layer (not shown).

The blocking oxide layer 110 precludes charges from entering a gate electrode (not shown) while the charges are trapped in the trap site of the charge-trapping layer 108, The blocking oxide layer 110 also precludes a back tunneling phenomenon in which the charges of the gate electrode are injected into the charge-trapping layer 108. The blocking oxide layer 110 may be formed of silicon oxide ($SiO_2$) or aluminum oxide ($Al_2O_3$). Thus, the tunnel insulating layer 106, the charge-trapping layer 108 and the blocking oxide layer 110 form an Oxide-Nitride-Oxide (ONO) stack structure.

The second capping conductive layer 112 is used as an etch mask when the ONO stack structure is etched. The second capping conductive layer 112 is also used as a gate electrode to switch the SONOS memory device. The second capping conductive layer 112 may be a polysilicon layer.

The cell region has a stack structure including the tunnel insulating layer 106, the charge-trapping layer 108, the blocking oxide layer 110 and the second capping conductive layer 112 formed over the semiconductor substrate 100. The peri region has a stack structure of the gate insulating layer 102, the first capping conductive layer 104, the tunnel insulating layer 106, the charge-trapping layer 108, the blocking oxide layer 110 and the second capping conductive layer 112 formed over the semiconductor substrate 100. A height difference occurs between the cell region and the peri region due to the first capping conductive layer 104 being thickly formed in the peri region, resulting in the formation of a severe step.

A photoresist is coated on the second capping conductive layer 112 to form a photoresist layer. The photoresist layer is patterned by exposure and development employing a predetermined mask. Thus, a first photoresist pattern 114 having an aperture is formed in a region in which the gate of the peri region will be formed.

Figure 1B:
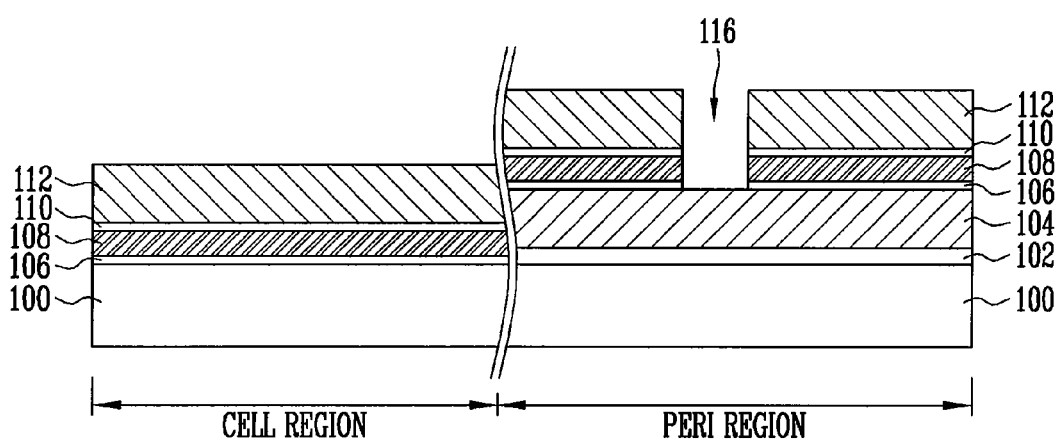

Referring to FIG. 1B, the second capping conductive layer 112, the blocking oxide layer 110, the charge-trapping layer 108 and the tunnel insulating layer 106 in the peri region are etched by an etch process using the first photoresist pattern 114 as an etch mask. Thus, a contact hole 116 is formed. The contact hole exposes part of the first capping conductive layer 104. The second capping conductive layer 112 may be used as an etch mask. The second capping conductive layer forms a gate electrode. The first photoresist pattern 114 is then removed.

Figure 1C:
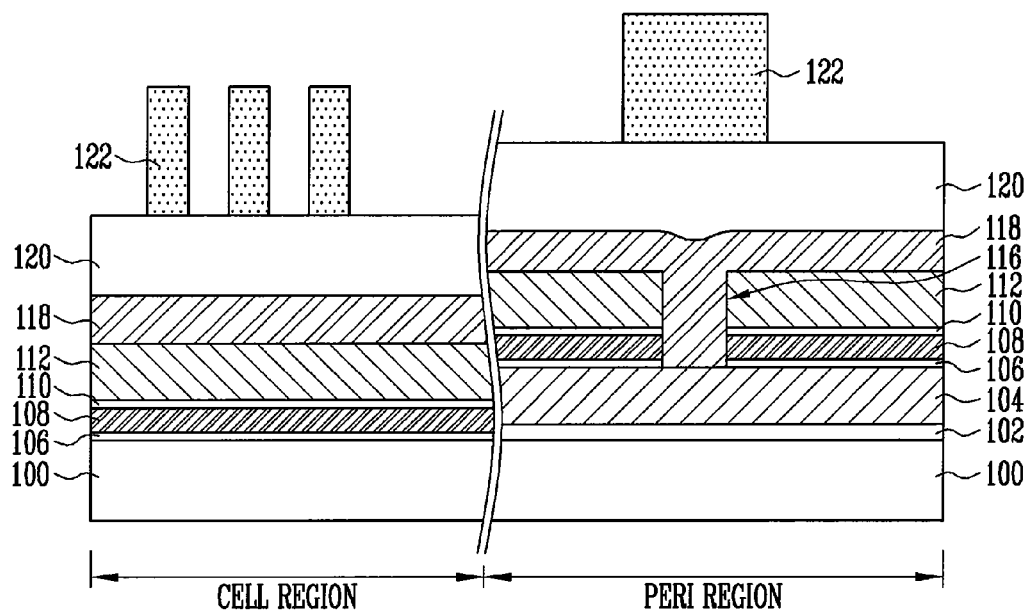

Referring to FIG. 1C, a metal layer 118 and a hard mask 120 are sequentially formed over the second capping conductive layer 112 including the contact hole 116. The metal layer 118 gap-fills the contact hole 116 and connects the first capping conductive layer 104 and the second capping conductive layer 112 to form the transistor of the peri region.

The metal layer 118 may have a stack layer of tungsten (W)/tungsten nitride (WN) to lower the resistance of a gate electrode to be formed subsequently. The hard mask 120 may be formed of an oxide or a nitride-based substance or may be formed from silicon oxynitride (SiON) or silicon nitride ($Si_xN_y$). A second photoresist pattern 122 is then formed on the hard mask 120. The second photoresist pattern 122 is pattered to define a region in which a word line and a gate will be formed in the cell region and the peri region.

Figure 1D:
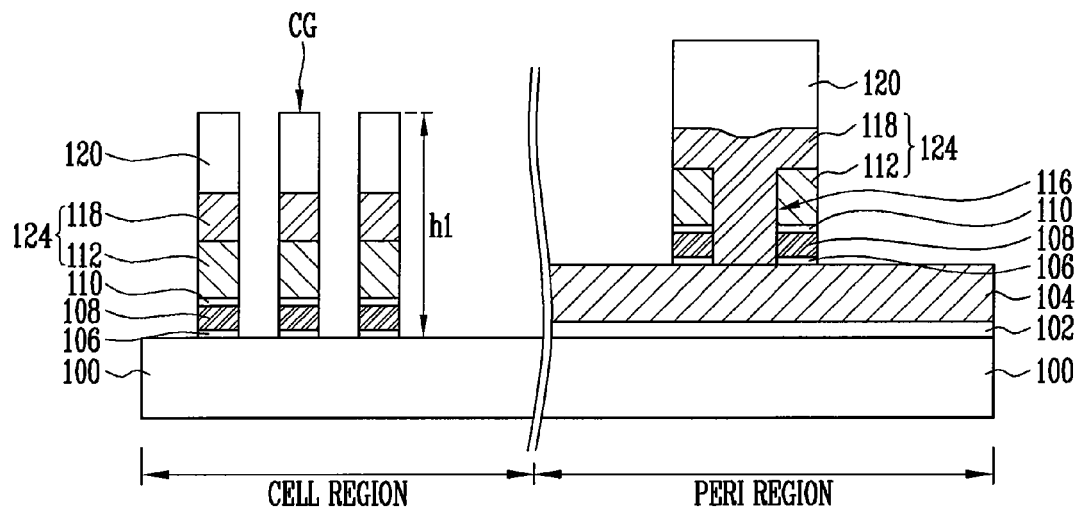

Referring to FIG. 1D, the hard mask 120, the metal layer 118, the second capping conductive layer 112, the blocking oxide layer 110, the charge-trapping layer 108 and the tunnel insulating layer 106 of the cell region and the peri region are sequentially etched by an etch process using the second photoresist pattern 122 as an etch mask. The second capping conductive layer 112 and the metal layer 118 form a gate electrode 124.

Therefore, a cell gate CG having the stack structure of the tunnel insulating layer 106, the charge-trapping layer 108, the blocking oxide layer 110, the gate electrode 124 and the hard mask 120 is formed in the cell region. The cell gate CG has a total height of h1. The second photoresist pattern 122 is then removed.

Figure 1E:
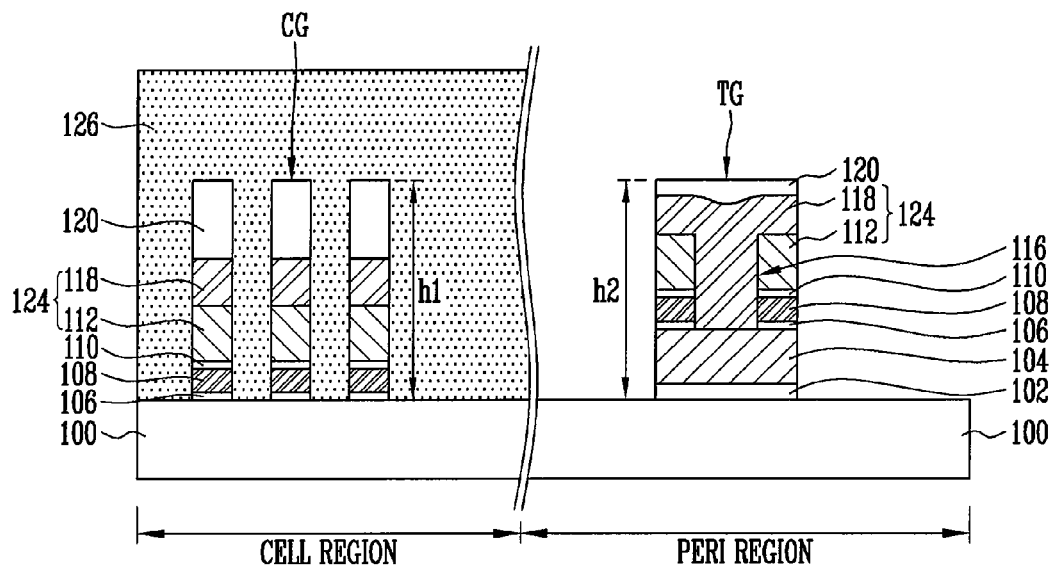

Referring to FIG. 1E, a third photoresist pattern 126 is formed over the semiconductor substrate 100 including the cell gate CG of the cell region to cover the entire cell region, but not the peri region. The first capping conductive layer 104 and the gate insulating layer 102 are patterned in the peri region except for the region in which the transistor will be formed. The first capping conductive layer 104 and the gate insulating layer 102 are patterned by an etch process using the third photoresist pattern 126 as an etch mask.

While the first capping conductive layer 104 is patterned, the hard mask 120 is also etched. The etch selectivities of the hard mask 120 and the first capping conductive layer 104 are controlled such that the difference in the height of the hard mask 120 and the cell gate CG formed in the cell region is reduced. Preferably, the hard mask 120 is also etched when the first capping conductive layer 104 is patterned. After the first capping conductive layer 104 is completely patterned, the etch selectivities of the hard mask 120 and the first capping conductive layer 104 are controlled so that the surface height of the hard mask 120 of the peri region is substantially identical to that of the hard mask 120 of the cell region.

Alternatively, after the first capping conductive layer 104 is patterned, the hard mask 120 may be etched. After the hard mask 120 is etched, the etch selectivities of the hard mask 120 and the first capping conductive layer 104 can be controlled so that the surface height of the hard mask 120 of the peri region is substantially identical to that of the hard mask 120 of the cell region.

Thus, the stack structure of the gate insulating layer 102, the first capping conductive layer 104, the tunnel insulating layer 106, the charge-trapping layer 108, the blocking oxide layer 110, the gate electrode 124 and the hard mask 120 is formed in the peri region. A gate TG for a transistor is formed in which the first capping conductive layer 104 and the second capping conductive layer 112 are connected by the metal layer 118. A total height h2 of the gate TG for the peri region transistor becomes substantially identical to the total height h1 of the cell gate CG by lowering the thickness of the hard mask 120 of the peri region. In other words, the total the height h2 of the gate TG for the peri region transistor and the total height h1 of the cell gate CG fulfill the relationship of h2=h1.

If the step between the total height h1 of the cell gate CG and the total height h2 of the gate TG for the peri region transistor decreases, degradation of a SAC nitride layer formed on the gate TG of the peri region transistor can be prevented in a subsequent process of polishing the interlayer insulating layer. The interlayer insulating layer is polished to form a contact plug after the SAC nitride layer and the interlayer insulating layer are formed over the cell gate CG and the gate TG of the peri region transistor. The hump phenomenon of the peri region transistor is thereby improved.

Figure 1F:
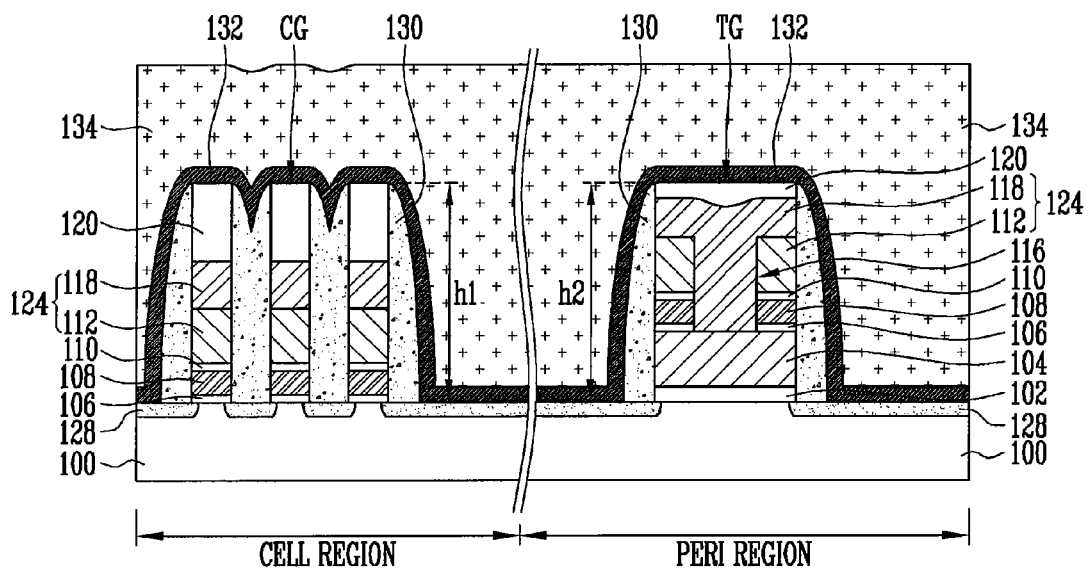

Referring to FIG. 1F, after the third photoresist pattern 126 is removed, an impurity is implanted into the semiconductor substrate 100 on the sides of the cell gate CG by an ion implantation process, thereby forming a junction region 128 of the source/drain region. A junction region 128 is also formed in the semiconductor substrate 100 on the sides of the gate TG for the peri region transistor. A memory cell including the junction region 128 and the cell gate CG is formed in the cell region. A peri region transistor including the junction region 128 and the gate TG for the transistor is formed in the peri region.

An insulating substance is then deposited over the semiconductor substrate 100 including the cell gate CG and the gate TG for the peri region transistor, thereby forming an insulating layer (not shown). A spacer 130 is then formed on the sidewalls of the cell gate CG and the gate TG for the peri region transistor by a spacer etch process.

A SAC nitride layer 132 and an interlayer insulating layer 134 are formed over the semiconductor substrate 100 including the spacer 130, the cell gate CG, and the gate TG for the peri region transistor. The SAC nitride layer 132 serves to protect the gates CG and TG in a subsequent process of polishing the interlayer insulating layer 134 to form a contact plug.

Silicon nitride (SixNy) or silicon oxynitride (SiON) can be formed along the surface of the gates CG and TG in which the spacer 130 is formed. The interlayer insulating layer 134 may include any kind of insulating substance. The interlayer insulating layer 134 may be formed by one of the following: Spin On Glass (SOG), Boron-Phosphorus Silicate Glass (BPSG), Plasma Enhanced Tetra Ortho Silicate Glass (PETEOS), Undoped Silicate Glass (USG), Phosphorus Silicate Glass (PSG) or Inter Poly Oxide (IPO).

Figure 1G:
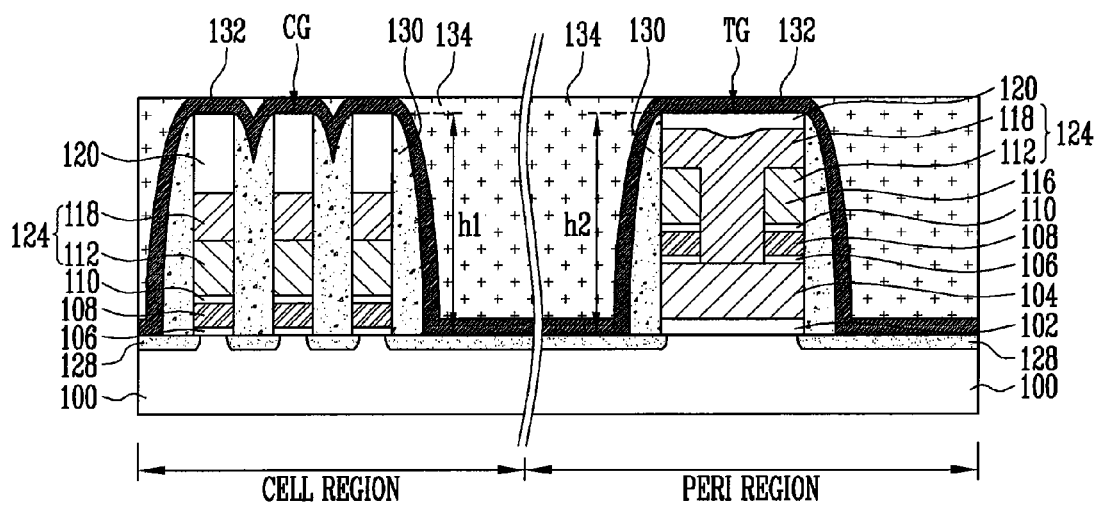

Referring to FIG. 1G, the interlayer insulating layer 132 is etched to expose the SAC nitride layer 130. The etch process can be performed by Chemical Mechanical Polishing (CMP).

The polishing process is stopped when the surface of the SAC nitride layer 130 is exposed because the step between the total heights h1 and h2 of the cell gate CG of the cell region and the gate TG of the peri region transistor is small. Thus, loss of the SAC nitride layer 130 can be prevented. Accordingly, an impurity does not infiltrate into the bottom of the gate of the peri region transistor through a removed portion of the SAC nitride layer. Thus, the leakage current characteristic of the peri region transistor can be improved.

As described above, according to the present invention, in a process of patterning the lower capping conductive layer of the peri region, a step formed between the cell gate and the gate for the peri region transistor is decreased by controlling a target etch thickness of the hard mask. Accordingly, a hump phenomenon of the transistor formed in the peri region can be improved. Furthermore, the leakage current characteristic of the transistor formed in the peri region can be improved.

Although the foregoing description has been made with reference to a specific embodiment, it is to be understood that changes and modifications of the present patent may be made by one having ordinary skill in the art without departing from the spirit and scope of the present invention and appended claims.

What is claimed is:

1. A method of fabricating a flash memory device, the method:
   forming a stack layer in a cell region of a semiconductor substrate, wherein the stack layer comprises a tunnel insulating layer, a charge-trapping layer, a blocking oxide layer and a first capping conductive layer;
   forming a gate insulating layer, a second capping conductive layer and the stack layer in a peri region of the semiconductor substrate;
   etching the stack layer at a region where a gate will be formed in the peri region, thereby forming a contact hole;
   forming a metal layer and a hard mask over the stack layer including the contact hole;
   patterning the stack layer of the cell region and the peri region to form a cell gate in the cell region; and
   etching the hard mask so that a step formed between the cell region and the peri region is decreased while patterning the second capping conductive layer of the peri region, thereby forming a gate of a transistor in the peri region.

2. The method of claim 1, wherein the first and second capping conductive layers are polysilicon layers.

3. The method of claim 1, wherein the hard mask is formed from an oxide or a nitride-based substance.

4. The method of claim 1, further comprising controlling etch selectivities of the second capping conductive layer and the hard mask while the second capping conductive layer is patterned.

5. The method of claim 1, wherein the charge-trapping layer is formed from a nitride-based substance.

6. The method of claim 1, wherein the metal layer has a stack layer formed of tungsten (W)/tungsten nitride (WN).

7. The method of claim 1, further comprising, after forming the gate of the transistor in the peri region,
   forming a spacer on sidewalls of the cell region and the gate of the transistor;
   forming a SAC nitride layer and an interlayer insulating layer over the cell region and the gate of the transistor including the spacer; and
   etching the interlayer insulating layer to expose the SAC nitride layer.

8. The method of claim 7, wherein etching the interlayer insulating layer is performed by chemical mechanical polishing.

9. The method of claim 1, further comprising, after forming the gate of the transistor in the peri region, performing an ion implantation process to form junction regions.

10. A method of fabricating a flash memory device, the method comprising:
   forming a stack layer in a cell region of a semiconductor substrate, wherein the stack layer comprises a tunnel insulating layer, a charge-trapping layer, a blocking oxide layer and a first capping conductive layer;
   forming a gate insulating layer, a second capping conductive layer and the stack layer in a peri region of the semiconductor substrate;
   etching the stack layer at a region where a gate will be formed in the peri region, thereby forming a contact hole;
   forming a metal layer and a hard mask over the stack layer including the contact hole;
   patterning the stack layer of the cell region and the peri region to form a cell gate in the cell region;
   patterning the second capping conductive layer and the gate insulating layer in the peri region; and
   etching the hard mask of the peri region so that a step formed between the cell region and the peri region is decreased, thereby forming the gate of a transistor in the peri region.

11. The method of claim 10, wherein the first and second capping conductive layers are polysilicon layers.

12. The method of claim 10, wherein the hard mask is formed from an oxide or a nitride-based substance.

13. The method of claim 10, further comprising controlling etch selectivities of the second capping conductive layer and the hard mask while the hard mask is etched.

14. The method of claim 10, wherein the charge-trapping layer is formed from a nitride-based substance.

15. The method of claim 10, wherein the metal layer has a stack layer formed of tungsten (W)/tungsten nitride (WN).

16. The method of claim 10, further comprising, after forming the gate of the transistor in the peri region, forming a spacer on sidewalls of the cell region and the gate of the transistor;

forming a SAC nitride layer and an interlayer insulating layer over the cell region and the gate of the transistor including the spacer; and etching the interlayer insulating layer to expose the SAC nitride layer.

17. The method of claim 16, wherein etching the interlayer insulating layer is performed by chemical mechanical polishing.

18. The method of claim 10, further comprising, after forming the gate of the transistor in the peri region, performing an ion implantation process to form junction regions.

* * * * *